(12) United States Patent
Amano et al.

(10) Patent No.: US 11,482,358 B2
(45) Date of Patent: Oct. 25, 2022

(54) CONTROL METHOD FOR SUPERCONDUCTING MAGNET APPARATUS AND SUPERCONDUCTING MAGNET APPARATUS

(71) Applicants: Kabushiki Kaisha Toshiba, Minato-ku (JP); Toshiba Energy Systems & Solutions Corporation, Kawasaki (JP)

(72) Inventors: Saki Amano, Yokohama (JP); Shohei Takami, Yokohama (JP)

(73) Assignees: Kabushiki Kaisha Toshiba, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 553 days.

(21) Appl. No.: 16/381,021

(22) Filed: Apr. 11, 2019

(65) Prior Publication Data

US 2019/0362874 A1 Nov. 28, 2019

(30) Foreign Application Priority Data

May 23, 2018 (JP) .............................. JP2018-098757

(51) Int. Cl.
  *H01F 6/06* (2006.01)
  *H01F 6/04* (2006.01)
  *G01R 33/3815* (2006.01)

(52) U.S. Cl.
  CPC ........... *H01F 6/06* (2013.01); *G01R 33/3815* (2013.01); *H01F 6/04* (2013.01)

(58) Field of Classification Search
  CPC ....................................................... H01F 6/06
  See application file for complete search history.

(56) References Cited

U.S. PATENT DOCUMENTS

| 2002/0000807 A1 | 1/2002 | Nakamura et al. |
| 2016/0049228 A1* | 2/2016 | Schauwecker .......... H01F 6/006 |
| | | 505/163 |
| 2016/0233011 A1 | 8/2016 | Eguchi |

FOREIGN PATENT DOCUMENTS

| JP | 2003-151821 A | 5/2003 |
| JP | 2004-179413 A | 6/2004 |
| JP | 4896620 | 3/2012 |
| JP | 2017-33977 | 2/2017 |
| JP | 2018-22791 | 2/2018 |
| WO | WO 2014/096995 A1 | 6/2014 |
| WO | WO 2016/093085 A1 | 6/2016 |

* cited by examiner

*Primary Examiner* — Paul A Wartalowicz
(74) *Attorney, Agent, or Firm* — Oblon, McClelland, Maier & Neustadt, L.L.P.

(57) ABSTRACT

A control method for a superconducting magnet apparatus comprising steps of: causing a superconducting coil to transition to a superconductive state by causing a cooler to cool the superconducting coil to or below a critical temperature; supplying electric current to the superconducting coil, which has transitioned to the superconductive state, from an excitation power supply; starting a persistent current mode by stopping supply of the electric current; adjusting temperature of the superconducting coil to a specific temperature which is equal to or lower than the critical temperature and higher than a steady operation temperature; and starting a steady operation by cooling the superconducting coil to or below the steady operation temperature, after a specific condition for stabilizing a magnetic field of the superconducting coil is satisfied.

8 Claims, 16 Drawing Sheets

CONTROL METHOD FOR SUPERCONDUCTING MAGNET APPARATUS AND SUPERCONDUCTING MAGNET APPARATUS

CROSS-REFERENCE TO RELATED APPLICATION

This application is based upon and claims the benefit of priority from Japanese Patent Application No. 2018-098757, filed on May 23, 2018, the entire contents of which are incorporated herein by reference.

FIELD

Embodiments described herein relate generally to a control method for a superconducting magnet apparatus and a superconducting magnet apparatus.

BACKGROUND

Conventionally, a technique using a superconducting magnet apparatus is known. For instance, a superconducting magnet apparatus is used in a field requiring a strong magnetic field which is free from errors as in an MRI (Magnetic Resonance Imaging) diagnostic apparatus.

[Patent Document 1] International Publication No. 2016/093085

The central magnetic field of a superconducting coil includes a noise magnetic field based on an eddy current which is generated inside the superconducting coil. The apparent intensity value of this central magnetic field is an intensity value including the noise magnetic field. When its cooler is temporarily stopped due to a phenomenon such as power outage, the temperature of the superconducting coil is raised and thereby aspect of the noise magnetic field is changed. For instance, as the eddy current disappears due to the temperature rise, the noise magnetic field also disappears. In other words, when the cooler is temporarily stopped, the intensity value of the central magnetic field changes. In a situation where ultrahigh precision central magnetic field is required, it is required that the intensity value of the central magnetic field is stable without being changed.

In view of the above-described circumstances, an object of embodiments of the present invention is to provide a control technique which allows a superconducting magnet apparatus to stabilize its magnetic field intensity.

DETAILED DESCRIPTION

In one embodiment of the present invention, a control method for a superconducting magnet apparatus comprising steps of: causing a superconducting coil to transition to a superconductive state by causing a cooler to cool the superconducting coil to or below a critical temperature; supplying electric current to the superconducting coil, which has transitioned to the superconductive state, from an excitation power supply; starting a persistent current mode by stopping supply of the electric current; adjusting temperature of the superconducting coil to a specific temperature which is equal to or lower than the critical temperature and higher than a steady operation temperature; and starting a steady operation by cooling the superconducting coil to or below the steady operation temperature, after a specific condition for stabilizing a magnetic field of the superconducting coil is satisfied.

According to embodiments of the present invention provide to a control technique which allows a superconducting magnet apparatus to stabilize its magnetic field intensity.

First Embodiment

Hereinafter, embodiments will be described by referring to the accompanying drawings. First, a superconducting magnet apparatus of the first embodiment will be described by referring to FIG. 1 to FIG. 6. The reference sign 1 in FIG. 1 denotes a superconducting magnet apparatus which can operate in a persistent current mode. The persistent current mode is an operation mode in which a circuit constituting the superconducting magnet apparatus 1 forms a closed loop and electric current permanently flows along this closed loop when this circuit is cooled below the critical temperature so as to transition to the superconductive state.

Figure 1:
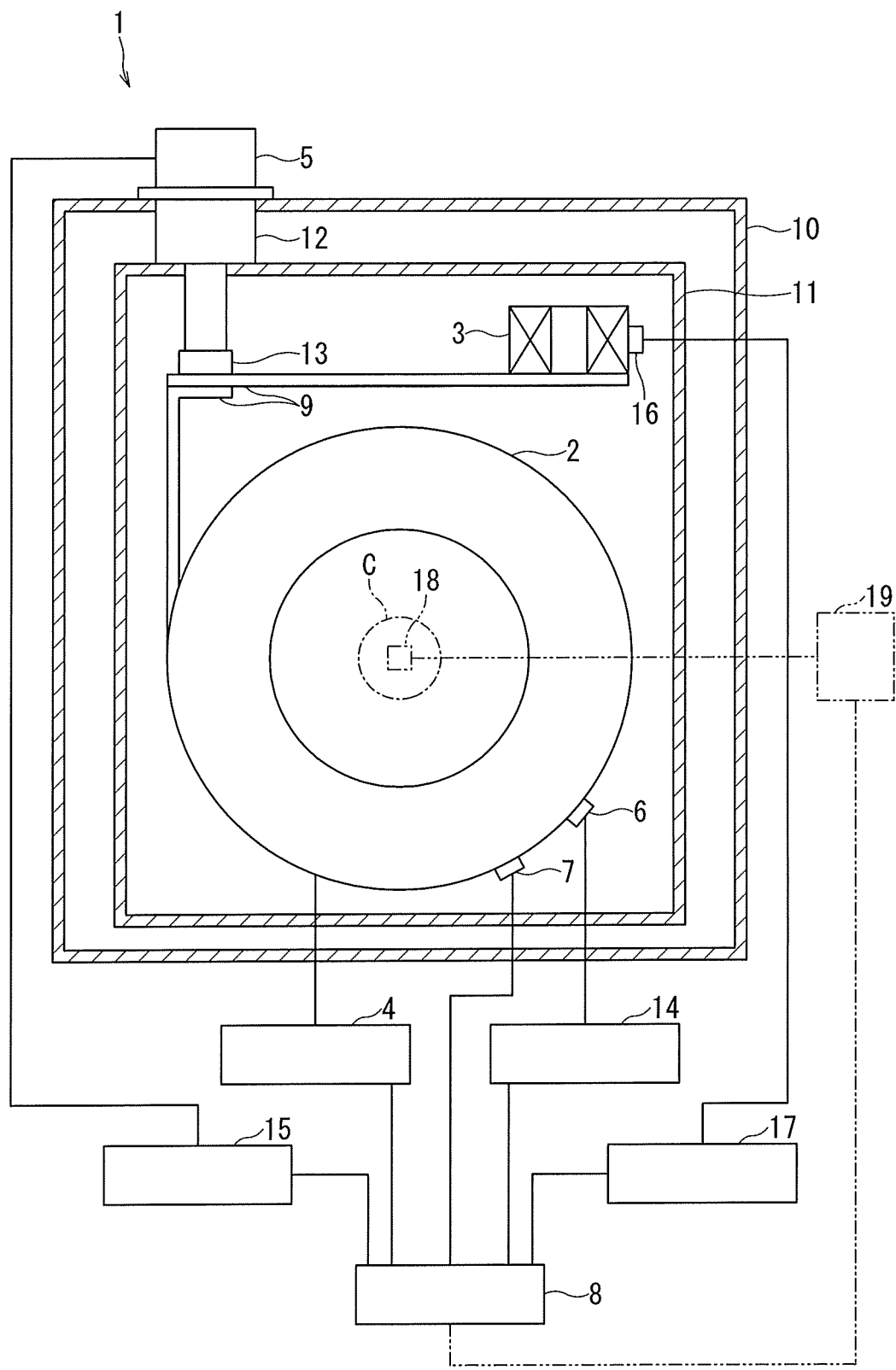
FIG. 1 is a cross-sectional view illustrating a superconducting magnet apparatus according to the first embodiment.

As shown in FIG. 1, the superconducting magnet apparatus 1 includes a superconducting coil 2 as a main coil, a persistent current switch 3 constituting a superconducting circuit together with the superconducting coil 2, an excitation power supply 4 for supplying electric power to the superconducting coil 2, a cooler (i.e., refrigerator or cooling unit) 5 for cooling the superconducting coil 2 and the persistent current switch 3, a coil heater 6 attached to the superconducting coil 2, a temperature sensor 7 for detecting the temperature of the superconducting coil 2, and a control device 8 for controlling the respective components. In the following description, the persistent current switch may be abbreviated as PCS.

The superconducting magnet apparatus 1 further includes a cooling medium 9 connected to each of the superconducting coil 2 and the persistent current switch 3 for conducting heat to the cooler 5, a vacuum vessel 10 for accommodating the superconducting coil 2 and the persistent current switch 3, a radiation shield 11 disposed inside the vacuum container 10, a first cooling stage 12 connected to the cooler 5, and a second cooling stage 13 as a conduction unit connected to the first cooling stage 12.

The superconducting magnet apparatus 1 further includes a coil-heater power-supply 14 for supplying electric power to the coil heater 6, a cooler power-supply 15 for supplying electric power to the cooler 5, a PCS heater 16 for heating the persistent current switch 3, and a PCS-heater power-supply 17 for supplying electric power to the PCS heater 16.

At a manufacturing stage or an installation stage of the superconducting magnet apparatus 1, a magnetic field sensor 18 for measuring magnetic field intensity of the central magnetic field C of the superconducting coil 2 is temporarily attached to the superconducting magnet apparatus 1. Further, the superconducting magnet apparatus 1 is provided with an analyzer 19 which preliminarily analyzes the relationship between the central magnetic field C and the temperature of the superconducting coil 2 on the basis of the magnetic field intensity measured by the magnetic field sensor 18. The magnetic field sensor 18 and the analyzer 19 are not necessarily required to be provided in the superconducting magnet apparatus 1 in the actual operation stage.

The central magnetic field C is the magnetic field generated in the portion where superconducting magnet apparatus 1 is required in the actual operation stage. Although the central magnetic field C is illustrated as a magnetic field at the center of the superconducting coil 2 in FIG. 1, the central magnetic field C is not limited to the magnetic field located at the center of the superconducting coil 2. For instance, when plural superconducting coils 2 are disposed, the central magnetic field C may be formed outside each of the superconducting coils 2. In addition, the central magnetic field C may be formed at one location as a combination of the respective magnetic fields generated by the plural superconducting coils 2.

When the superconducting magnet apparatus 1 of the present embodiment starts a steady operation in the actual operation stage, the superconducting magnet apparatus 1 adjusts the temperature of the superconducting coil 2, which has transitioned to the superconductive state, to the specific temperature that is lower than the critical temperature and is higher than the steady operation temperature. After the specific conditions for stabilizing the central magnetic field C of the superconducting coil 2 are satisfied, the superconducting magnet apparatus 1 cools the superconducting coil 2 to or below the steady operation temperature and then starts the steady operation.

The superconducting magnet apparatus 1 of the present embodiment exemplifies a conduction cooling method in which the superconducting coil 2, the persistent current switch 3, and the cooler 5 are thermally connected via the cooling medium 9. The cooling medium 9 is made of a material having satisfactory thermal conductivity such as aluminum or copper. The cooler 5 is composed of a cryogenic refrigerator such as a GM refrigerator. Since the cooler 5 is a conduction cooling type, no refrigerant such as liquid helium is required and thus the superconducting coil 2 and the persistent current switch 3 can be easily cooled down. Additionally, since the superconducting coil 2 and the persistent current switch 3 are not immersed in a cooling medium such as liquid helium, the temperature of the superconducting coil 2 and the temperature of the persistent current switch 3 quickly respond when the cooler 5 is stopped due to a phenomenon such as power outage.

Next, the system configuration of the superconducting magnet apparatus 1 will be described by referring to the block diagram shown in FIG. 2.

Figure 2:
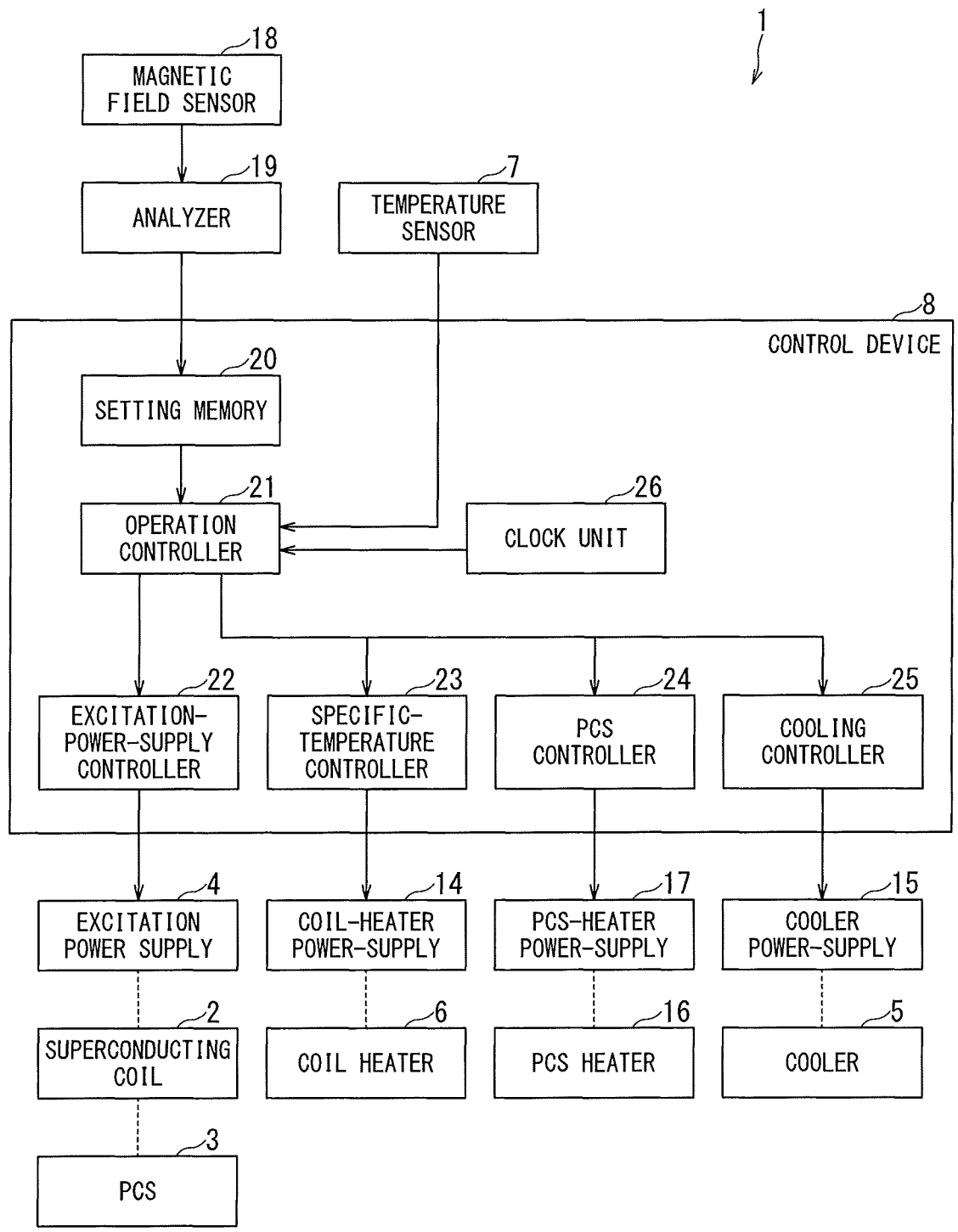
FIG. 2 is a block diagram illustrating the superconducting magnet apparatus according to the first embodiment.

As shown in FIG. 2, the control device 8 includes: a setting memory 20 for storing various settings related to the operation of the superconducting magnet apparatus 1; an operation controller 21 for controlling the operation (i.e., driving) of the superconducting magnet apparatus 1 by controlling the respective components in an integrated manner; an excitation-power-supply controller 22 for controlling the excitation power supply 4; a specific-temperature controller 23 for controlling the temperature of the superconducting coil 2 before start of the steady operation; a PCS controller 24 as a persistent current mode controller for controlling the persistent current switch 3 at the start of the persistent current mode; a cooling controller 25 for controlling the cooler power-supply 15; and a clock unit 26 (RTC: Real-Time Clock) for measuring elapsed time.

The analyzer 19 preliminarily analyzes the correspondence relationship between the central magnetic field C and the temperature of the superconducting coil 2 in the superconducting coil 2 that has transitioned to the superconducting state, and determines the specific conditions. It should be noted that the correspondence relationship between the central magnetic field C and the temperature of the superconducting coil 2 may be obtained by experiment (i.e., actual measurement). Further, this correspondence relationship may be obtained by analyzing the experiment result (i.e., by calculation from the experiment result).

After electric current is supplied to the superconducting coil 2 from the excitation power supply 4, the PCS controller 24 performs control of stopping the supply of the electric current and starting the persistent current mode. The specific-temperature controller 23 controls the superconducting coil 2 having transitioned to the superconductive state such that the temperature of the superconducting coil 2 becomes equal to or lower than the critical temperature and higher than the steady operation temperature. After the specific conditions under which the central magnetic field C of the superconducting coil 2 is stabilized are satisfied, the operation controller 21 cools the superconducting coil 2 at the specific temperature S to the steady operation temperature or lower so as to start the steady operation.

The control device 8 of the present embodiment includes hardware resources such as a CPU (Central Processing Unit), a ROM (Read Only Memory), a RAM (Random Access Memory), and a HDD (Hard Disc Drive), and is configured as a computer in which information processing by software is achieved with the use of the hardware resources by causing the CPU to execute various programs. Further, the control method for a superconducting magnet apparatus 1 of the present embodiment is achieved by causing the computer to execute the various programs.

Figure 3:
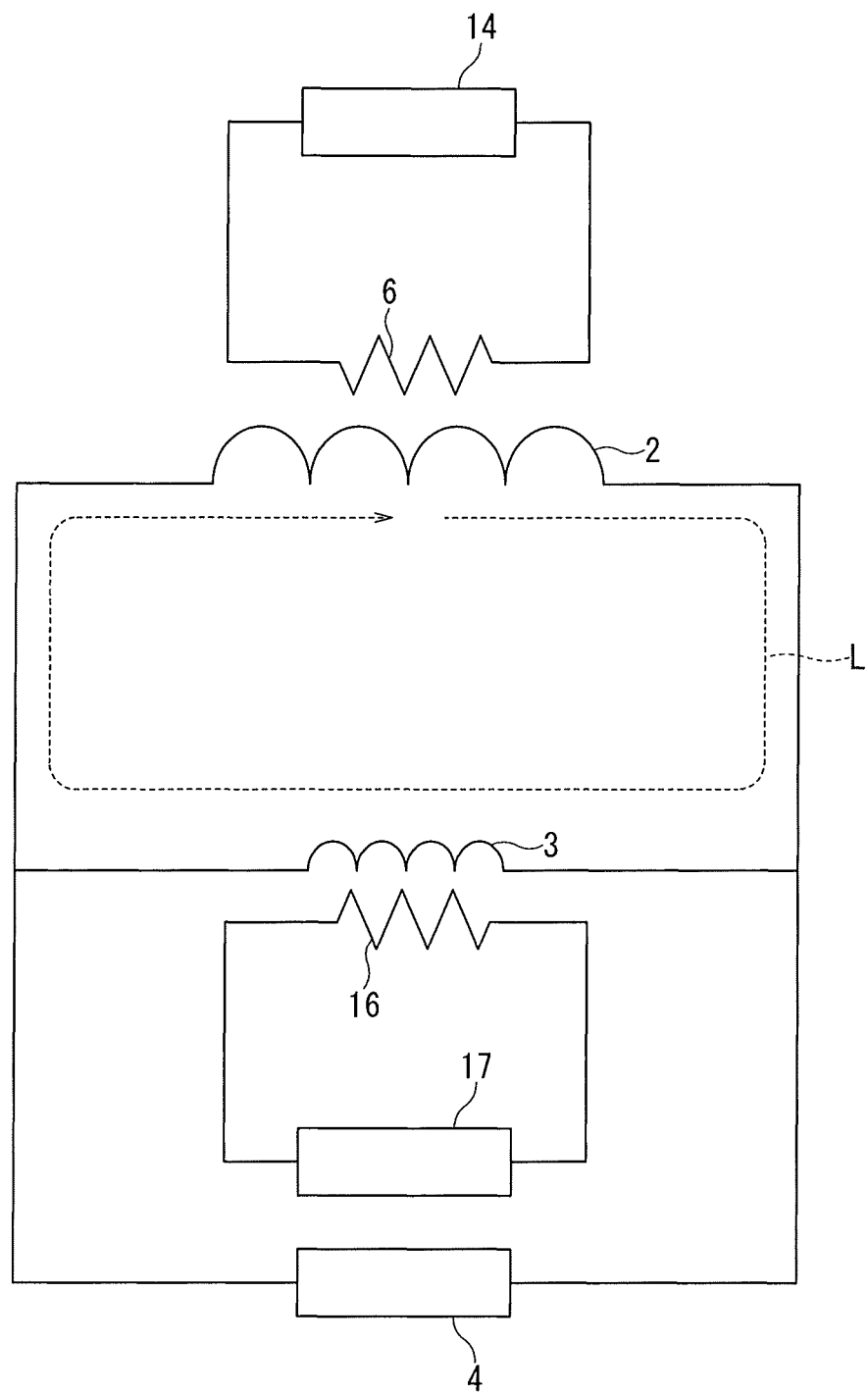
FIG. 3 is a circuit diagram illustrating the superconducting magnet apparatus according to the first embodiment.

Each of the superconducting coil 2 and the persistent current switch 3 is a coil around which a superconducting wire having a superconducting material conductor is wound. As shown in FIG. 3, both ends of the persistent current switch 3 are connected to both ends of the superconducting coil 2. In other words, the superconducting coil 2 and the persistent current switch 3 constitute a parallel circuit. In the persistent current mode, a closed loop L (i.e., persistent current coil) is formed by the superconducting coil 2 and the persistent current switch 3.

Further, the coil heater 6 or the PCS heater 16 may have any configuration as long as heat is conducted to the superconducting coil 2 or the persistent current switch 3. For instance, a film-shaped heater or a heater in the form of a heating wire may be used. In the case of using a film-shaped heater, it is preferable in terms of configuration that the heater is adhered to the surface of the coil or is inserted between the layers of the superconducting wire constituting the coil so as to be adhered to the coil. Further, in the case of using a heater in the form of a heating wire, it is preferable in terms of configuration to wind a heating wire on the surface of the coil or co-wind the heating wire along the superconducting wire constituting the coil.

Additionally, the conductor of the superconducting material can pass electric current in the superconductive state (i.e., in the state where its electrical resistance is zero) in an environment where the following three conditions are satisfied: (i) the temperature of the environment is the critical temperature or lower; (ii) magnetic field intensity of the environment is the critical magnetic field intensity or weaker; and (iii) the critical current value or lower. Thus, when electric current is passed through the closed loop L formed by the superconducting coil 2 and the persistent current switch 3 under the above-described state where its electrical resistance is zero, the electric current value can be maintained at a substantially constant value with almost no attenuation. In addition, fluctuation of the electric current flowing through the closed loop L is hard to occur, and thus it is possible to continue to generate a constant magnetic field with considerably high stability. Such a superconducting technique is applied to, e.g., a medical MRI apparatus requiring a high magnetic field stability of 0.1 ppm/h or less and/or an NMR apparatus for molecular structure analysis.

Further, the persistent current switch 3 can switch between the normal conducting state (OFF state) with high electrical resistance and the superconductive state (ON state) with zero electrical resistance. When the persistent current switch 3 is turned to the ON state, it enables the operation in the persistent current mode with the closed loop L of the superconducting coil 2 and the persistent current switch 3. Conversely, when the persistent current switch 3 is turned to the OFF state, the operation in the persistent current mode with the closed loop L is disabled due to the high electric resistance of the persistent current switch 3. In addition, when the persistent current switch 3 is heated by the PCS heater 16, it becomes the normal conducting state (i.e., OFF state). When the PCS heater 16 is stopped, it becomes the superconductive state (i.e., ON state).

The superconducting wire of each of the superconducting coil 2 and the persistent current switch 3 is composed of plural superconducting filaments and a base material (i.e., stabilizing material) around these superconducting filaments. The superconducting filaments are generally formed of NbTi but may be formed of another superconducting material except NbTi such as $Nb_3Sn$ and $MgB_2$. The base material of the superconducting coil 2 is generally formed of a low electric resistance metal such as copper. Additionally, the base material of the persistent current switch 3 is generally formed of metal having a high electric resistance such as CuNi.

When the superconducting coil 2 and the persistent current switch 3 are cooled to or below the critical temperature (i.e., superconducting transition temperature) so as to transition to the superconductive state, the electric resistance of each of the superconducting filaments becomes zero and electric current continues to flow in these superconducting filaments. In addition, when the temperature of the persistent current switch 3 is adjusted to a temperature higher than the critical temperature such that the persistent current switch 3 transitions to the normal conducting state, a high electric resistance is generated. By this electric resistance of the persistent current switch 3, the superconducting coil 2 can be excited.

The superconducting coil 2 having transitioned to the superconductive state generates the central magnetic field C that is predetermined at the design stage. However, a small eddy current is generated inside the superconducting wires constituting the superconducting coil 2, and the magnetic field resulting from this eddy current becomes noise and is included in the central magnetic field C. Various causes are considered as causes of this eddy current. For instance, it occurs inside the solder connecting the superconducting wires to each other or inside the base material around the superconducting filaments.

When an eddy current flows through a substance in the normal conducting state at normal temperature, the eddy current immediately disappears due to the electric resistance of this substance.

When lead as a superconducting substance contained in solder is cooled down to extremely low temperature, the electric resistance of the lead becomes extremely low and the eddy current generated at the region where the electric resistance is extremely low will not disappear but exist persistently. The same holds true for a non-superconducting substance such as copper contained in the base material. In particular, in the case of an eddy current flowing an electric path which straddles the base material and the superconducting filaments, this eddy current has a long time constant and requires a long time to disappear.

When the noise magnetic field based on such an eddy current is included in the central magnetic field C, a problem occurs when the cooler 5 is temporarily stopped due to a phenomenon such as power outage. When the cooler 5 is temporarily stopped, the temperature of the superconducting coil 2 is raised. When the power failure is immediately restored without causing the superconducting coil 2 to exceeding the critical temperature, the operation of the superconducting magnet apparatus 1 can be continued. However, due to the temporary rise in temperature of the superconducting coil 2, the electrical resistance of the lead contained in the solder and the electrical resistance of substances such as copper contained in the base material are rapidly increased, and the eddy current flowing through the substances disappears. Thus, the noise magnetic field caused by the eddy current disappears, and the intensity value of the central magnetic field C changes.

For instance, when the noise magnetic field acts to increase the central magnetic field C, the intensity value of the central magnetic field C is lowered after the temporary power outage. Conversely, when the noise magnetic field acts to cancel the central magnetic field C, the intensity value of the central magnetic field C increases after the temporary power outage. In other words, this noise magnetic field is a fluctuating component that causes the central magnetic field C to fluctuate. In a situation where high magnetic field stability is required, the intensity value of the central magnetic field C of the superconducting coil 2 is required to be stable without change.

For this reason, in the superconducting magnet apparatus 1 of the present embodiment, after the persistent current mode is started with the superconducting coil 2 having transitioned to the superconductive state, the superconducting coil 2 is heated by using the coil heater 6. By this temperature rise, the eddy current inside the superconducting coil 2 disappears and thereby the noise magnetic field also disappears. By starting the steady operation after elimination of the noise magnetic field under the above-described manner, the central magnetic field C will not change even when the cooler 5 temporarily stops due to a phenomenon such as power outage.

Figure 4:
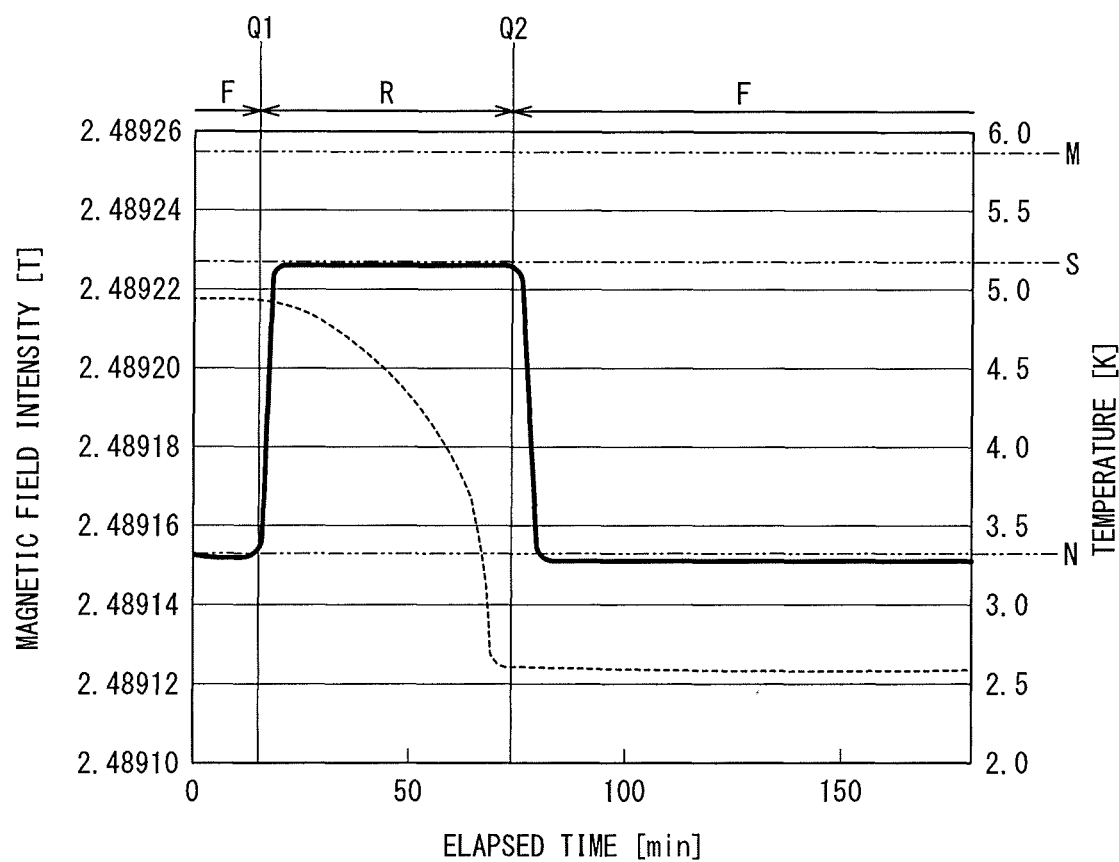
FIG. 4 is a graph illustrating relationship between the central magnetic field and temperature in the first embodiment.

FIG. 4 is a graph illustrating one case of the relationship between the central magnetic field C and the temperature of the superconducting coil 2. The temperature of the superconducting coil 2 is indicated by the solid line, and the intensity value of the central magnetic field C is indicated by the broken line.

First, when the cooler 5 is used to cool the superconducting coil 2 to or below the critical temperature M, the superconducting coil 2 is caused to transition to the superconductive state. In the temperature-fall period F immediately after this transition to superconductivity, the superconducting coil 2 is cooled to the steady operation temperature N or lower. Here, the central magnetic field C shows a stronger intensity value because the noise magnetic field is contained in the central magnetic field C.

At the time Q1, the coil heater 6 is activated and the superconducting coil 2 is heated until reaching the specific temperature S. This specific temperature S is equal to or lower than the critical temperature M and higher than the steady operation temperature N. Afterward, the temperature of the superconducting coil 2 is kept constant. In this temperature-rise period R, the eddy current inside the superconducting coil 2 disappears and thereby the noise magnetic field also disappears in the order of several minutes. Accordingly, the intensity value of the central magnetic field C decreases.

After the intensity value of the central magnetic field C is decreased, it is estimated that the noise magnetic field disappeared at the timing when the value of the central magnetic field C ceased to decrease. At the time Q2 after the intensity value of the central magnetic field C stopped changing, the coil heater 6 is stopped and the superconducting coil 2 is cooled again to the steady operation temperature N or lower. In the temperature-fall period F after the temperature-rise period R, the steady operation is started.

In the first embodiment, the output value to be predetermined or set is the value of the electric current flowing through the coil heater 6 when the superconducting coil 2 is heated to the specific temperature S. In addition, the temperature rise period R sufficiently long for dissipation of the noise magnetic field from time Q1 to time Q2 is set as the output period of the coil heater 6. The output period does not have to be one consecutive period. For instance, the temperature-rise period R and the temperature-fall period F may be alternately repeated to set the total period of the plural temperature-rise periods R as the output period.

In the first embodiment, the specific conditions are satisfied by activating the coil heater 6 with the predetermined output value to heat the superconducting coil 2 to the specified temperature S and operating the coil heater 6 until the predetermined output period elapses. The predetermined output value and the predetermined output period are obtained by analysis in advance. Then, the obtained output value and output period are stored in the setting memory 20 of the superconducting magnet apparatus 1.

In this manner, it is possible to preliminarily grasp the specific conditions and preliminarily determine the control content before the operation of the superconducting magnet apparatus 1 is started, and thus it is possible to easily control the superconducting magnet apparatus 1 during operation. Further, by controlling the operation of the coil heater 6, it is possible to establish the specific conditions.

The operation controller 21 of the control device 8 of the first embodiment determines whether the temperature of the superconducting coil 2 has reached the specific temperature S or not, on the basis of the temperature detected by the temperature sensor 7. The operation controller 21 determines whether the output period has elapsed or not, by time count with the use of the clock unit 26.

Next, on the basis of the flowchart of FIG. 5, a description will be given of an analysis method performed by the superconducting magnet apparatus 1 for previously determining the specific conditions under which the fluctuating component of the central magnetic field C disappears. In the description of the analytical method, the block diagram of FIG. 2 is also used as required.

Figure 5:
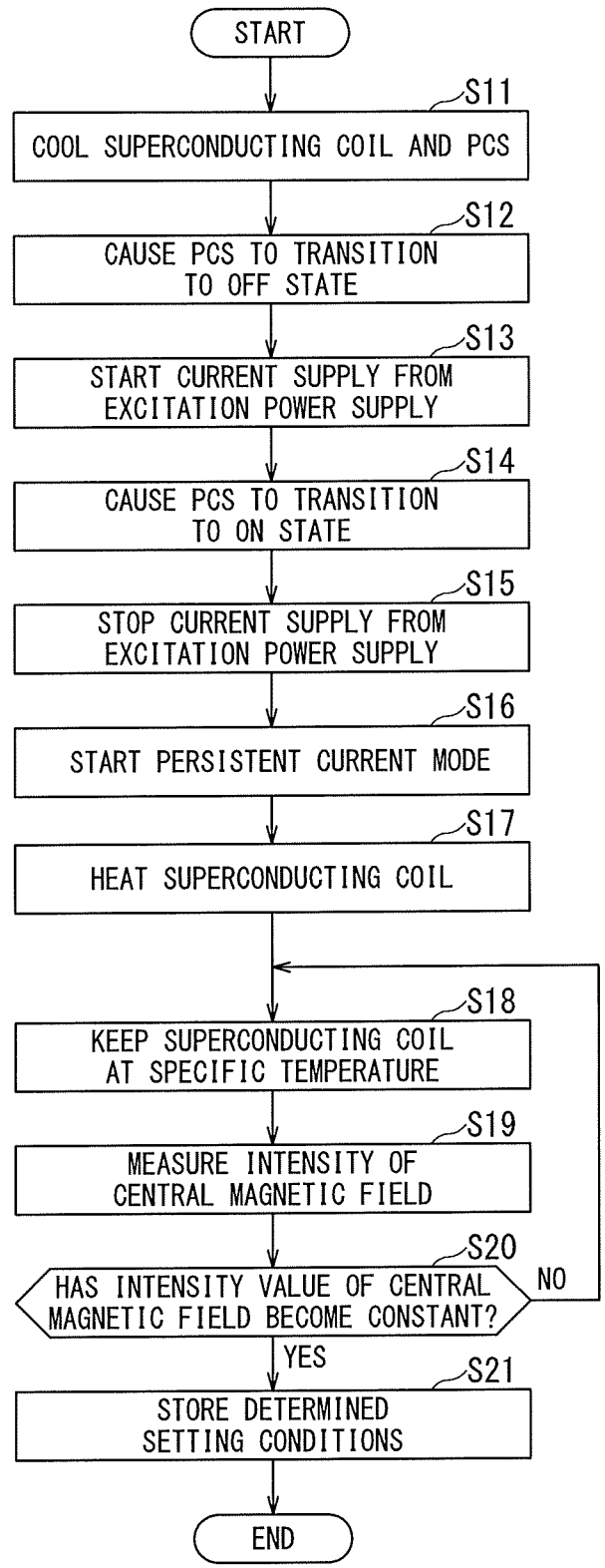
FIG. 5 is a flowchart illustrating an analysis method performed by the superconducting magnet apparatus according to the first embodiment.

First, in the step S11 as shown in FIG. 5, the cooling controller 25 starts to cool the superconducting coil 2 and the persistent current switch 3 by supplying electric current from the cooler power-supply 15 to the cooler 5 and operating the cooler 5. When the cooling operation begins, the superconducting coil 2 and the persistent current switch 3 are cooled to or below the critical temperature M. Consequently, the superconducting coil 2 and the persistent current switch 3 transition to the superconductive state. Further, the superconducting coil 2 and the persistent current switch 3 are cooled down until both reach the steady operation temperature N.

In the next step S12, under the state where cooling by the cooler 5 is continued, the PCS controller 24 supplies electric current from the PCS-heater power-supply 17 to the PCS heater 16 and activates the PCS heater 16. The PCS controller 24 uses the PCS heater 16 for heating the persistent current switch 3 so as to adjust the temperature of the persistent current switch 3 to a temperature higher than the critical temperature M. As a result, the persistent current switch 3 transitions to the normal conducting state (i.e., OFF state) of high electrical resistance.

In the next step S13, the excitation-power-supply controller 22 controls the excitation power supply 4 so as to start the current supply, and starts passing electric current through the superconducting coil 2. Consequently, the electric current flowing through the superconducting coil 2 becomes the value at the time of the steady operation.

In the next step S14, the PCS controller 24 stops the electric current supplied from the PCS-heater power-supply 17 to the PCS heater 16, and decreases the temperature of the persistent current switch 3 again. Here, when the temperature of the persistent current switch 3 becomes equal to or lower than the critical temperature M, the persistent current switch 3 transitions to the superconductive state (ON state) in which electric resistance is zero.

In the next step S15, the excitation-power-supply controller 22 controls the excitation power supply 4 to stop the current supply. At this time, the current flowing through the persistent current switch 3 starts to increase in response to the decrease in current supply amount of the excitation power supply 4.

In the next step S16, when the value of the electric current supplied from the excitation power supply 4 becomes zero, the electric current flowing through the persistent current switch 3 becomes the value at the time of the steady operation. In addition, the closed loop L is completed by the superconducting coil 2 and the persistent current switch 3, and thereby the persistent current mode is started.

In the next step S17, the specific-temperature controller 23 supplies electric current from the coil-heater power-supply 14 to the coil heater 6 and activates the coil heater 6. Further, the specific-temperature controller 23 heats the superconducting coil 2 by using the coil heater 6 and raises the temperature of the superconducting coil 2 until it reaches the specific temperature S. Incidentally, the operation controller 21 may determine whether the superconducting coil 2 has reached the specific temperature S or not, on the basis of the temperature detected by the temperature sensor 7 and input the determination result to the specific-temperature controller 23. In this case, The specific-temperature controller 23 may control the coil heater 6 on the basis of the determination result.

In the next step S18, the specific-temperature controller 23 controls the coil heater 6 to keep the temperature of the superconducting coil 2, which has reached the specified temperature S, constant.

In the next step S19, the analyzer 19 uses the magnetic field sensor 18 to measure the magnetic field intensity of the central magnetic field C of the superconducting coil 2.

In the next step S20, the analyzer 19 determines whether the intensity value of the central magnetic field C has become constant or not. When the intensity value of the central magnetic field C has not become constant (NO in the step S20), the processing returns to the step S18. Conversely, when the intensity value of the central magnetic field C has become constant (YES in the step S20), the processing proceeds to the step S21.

In the next step S21, the analyzer 19 determines the output value of the coil heater 6 necessary for raising the temperature of the superconducting coil 2 to the specific temperature S, and also determines the output time necessary for keeping the intensity value of the central magnetic field C constant. Then, the determined output value and output period are stored in the setting memory 20 of the superconducting magnet apparatus 1.

Next, the control method (i.e., operation method) for the superconducting magnet apparatus 1 in the actual operation stage will be described on the basis of the flowchart of FIG. 6 by referring to the block diagram of FIG. 2 as required. In the operation method for superconducting magnet apparatus 1, the steps S11 to S18 in FIG. 6 are the same as the steps S11 to S18 in FIG. 5 for illustrating the analysis method performed by the superconducting magnet apparatus 1, and duplicate description is omitted.

Figure 6:
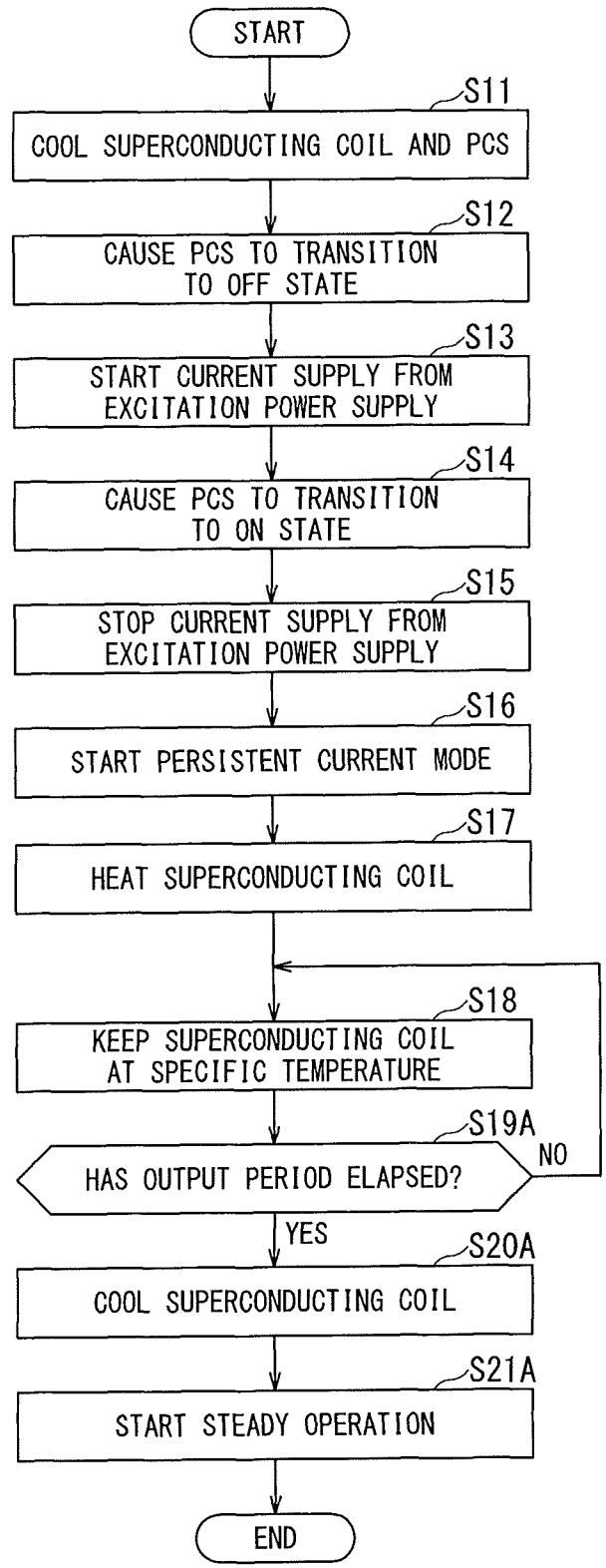
FIG. 6 is a flowchart illustrating a control method for the superconducting magnet apparatus according to the first embodiment.

As shown in FIG. 6, in the step S19A subsequent to the step S18, the operation controller 21 determines whether the predetermined output period stored in the setting memory 20 has elapsed or not, on the basis of time-counting processing performed by the clock unit 26. When the output period has not elapsed (NO in the step S19A), the processing returns to the above-described step S18. Conversely, when the output period has elapsed (YES in the step S19A), the processing proceeds to the step S20A.

In the next step S20A, the specific-temperature controller 23 stops the coil heater 6 by controlling the coil-heater power-supply 14 to stop the current supply. Consequently, the superconducting coil 2 is cooled again.

In the next step S21A, the steady operation is started by using the superconducting coil 2 that has been cooled to the steady operation temperature N.

In the superconducting magnet apparatus 1 of the first embodiment, the temperature of the superconducting coil 2 is raised until reaching the specific temperature S before start of the steady operation, and then the temperature of the superconducting coil 2 is kept constant at the specific temperature S until the specific conditions are satisfied, whereby the fluctuation component of the central magnetic field C can be reliably eliminated.

In addition, by providing the coil heater 6 in the superconducting coil 2, the heat of the coil heater 6 is directly conducted to the superconducting coil 2 and thus the superconducting coil 2 can be rapidly heated.

Second Embodiment

Next, the superconducting magnet apparatus 1A of the second embodiment will be described by referring to FIG. 7. Note that the same reference signs are assigned to the same components as the above-described embodiment, and duplicate description is omitted.

Figure 7:
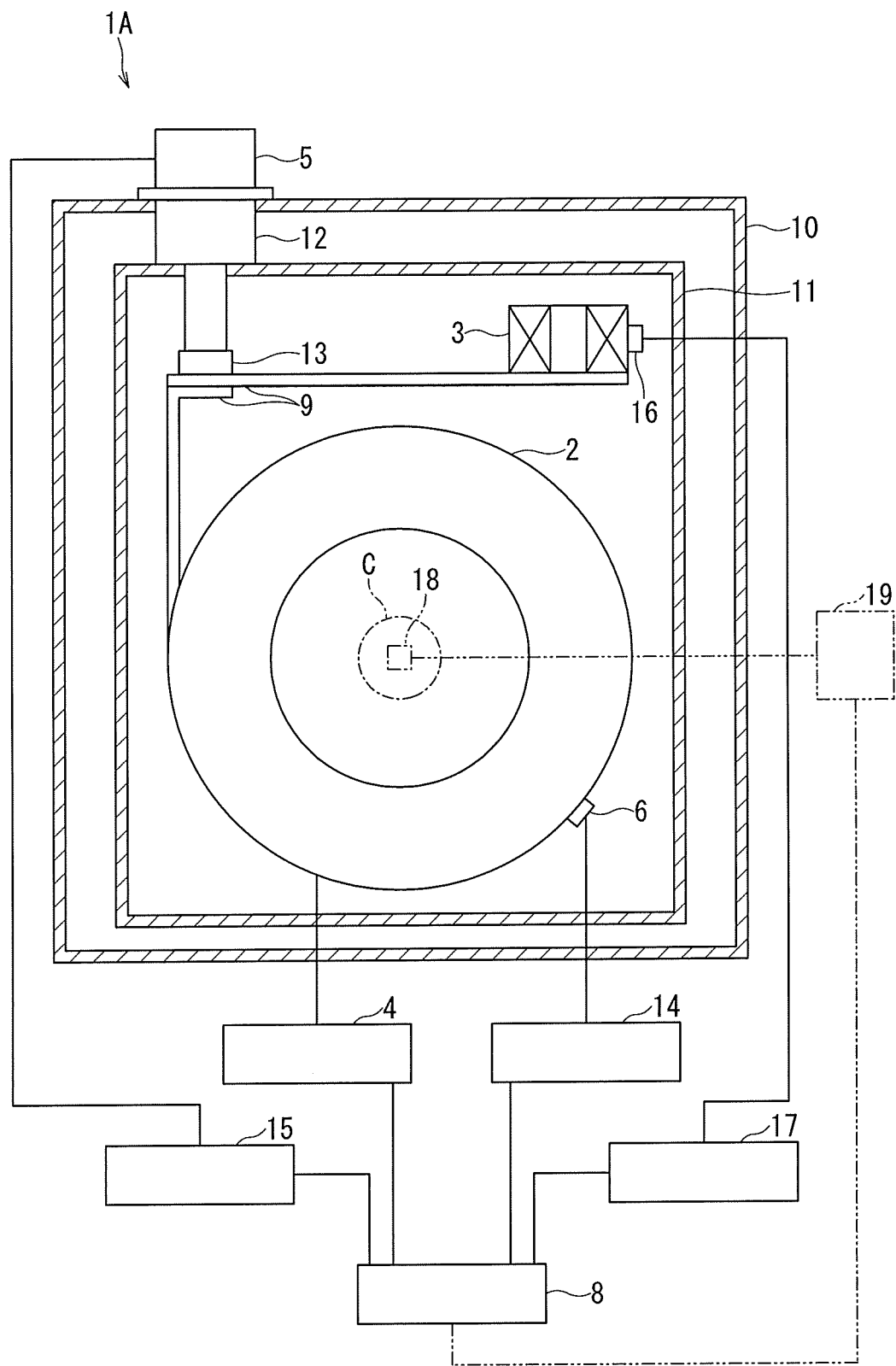
FIG. 7 is a cross-sectional view illustrating a superconducting magnet apparatus according to the second embodiment.

As shown in FIG. 7, in the superconducting magnet apparatus 1A of the second embodiment, the temperature sensor 7 (FIG. 1) of the above-described first embodiment is not provided. In the second embodiment, the output value necessary for the superconducting coil 2 to reach the specific temperature S is analyzed in advance and the setting value of the analyzed output value is stored in the setting memory 20 (FIG. 2). The control device 8 controls the operation of the superconducting magnet apparatus 1A in the actual operation stage only on the basis of the output value and the output period that are stored in the setting memory 20.

Since the temperature sensor 7 is omitted in the second embodiment, it is possible to simplify the control of adjusting the temperature of the superconducting coil 2 to the specific temperature S, in addition to that number of components of the superconducting magnet apparatus 1A can be reduced.

Third Embodiment

Next, the superconducting magnet apparatus 1A of the third embodiment will be described by referring to FIG. 8. Note that the same reference signs are assigned to the same components as the above-described embodiments, and duplicate description is omitted.

Figure 8:
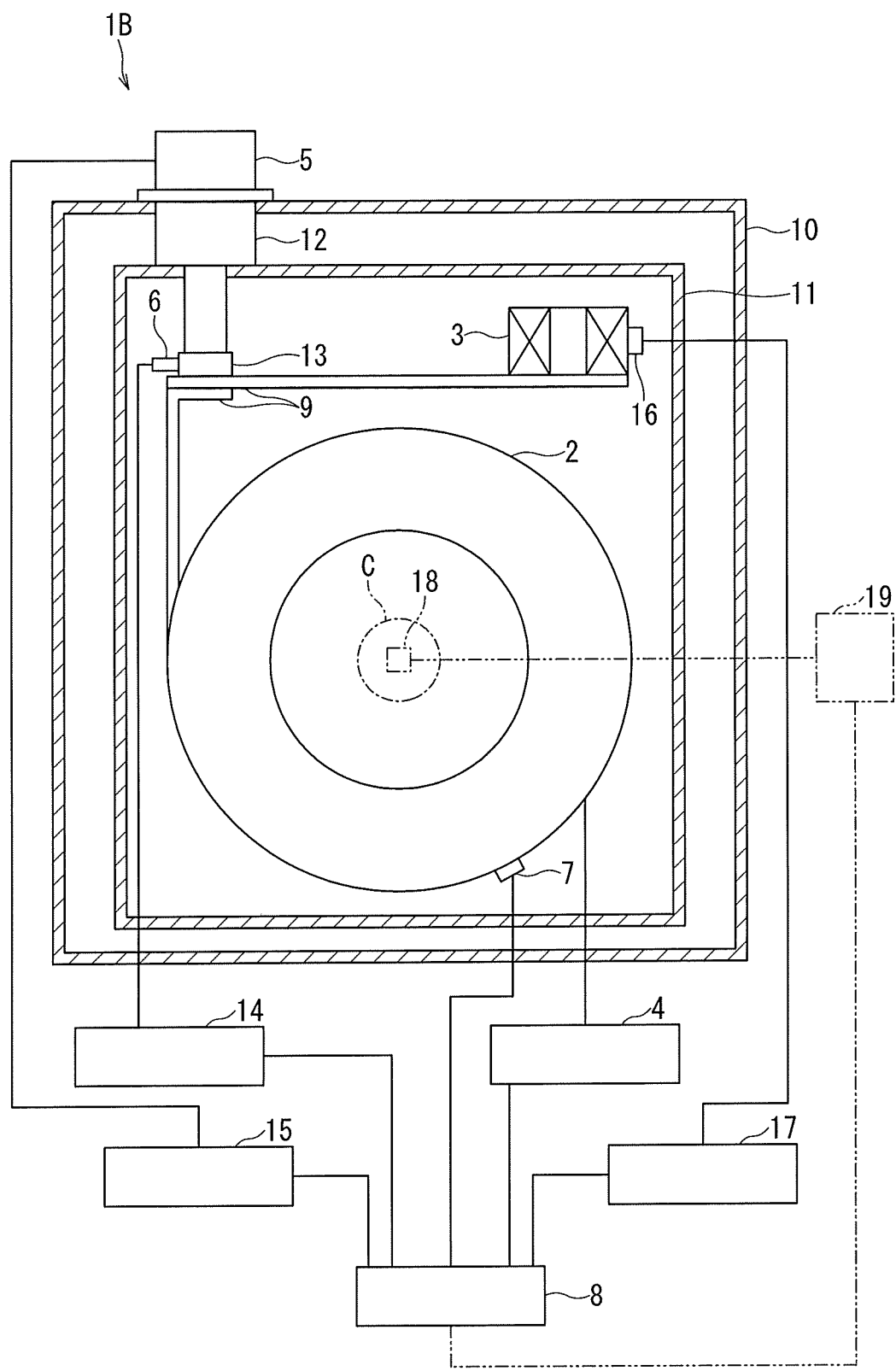
FIG. 8 is a cross-sectional view illustrating a superconducting magnet apparatus according to the third embodiment.

As shown in FIG. 8, in the superconducting magnet apparatus 1B of the third embodiment, the coil heater 6 for heating the superconducting coil 2 is attached to the second cooling stage 13 as a conduction unit. Excluding this point, the configuration of the superconducting magnet apparatus 1B of the third embodiment is the same as the superconducting magnet apparatus 1 of the first embodiment.

In the third embodiment, after the persistent current mode is started by using the superconducting coil 2 that has transitioned to the superconductive state, the temperature of the superconducting coil 2 is raised by using the coil heater 6. The heat of the coil heater 6 is conducted to the superconducting coil 2 via the second cooling stage 13.

In the third embodiment, since the coil heater 6 is provided in the second cooling stage 13 as the conducting unit for conducting heat from the superconducting coil 2 to the cooler 5, the heat of the coil heater 6 is gradually conducted to the superconducting coil 2 and thus the temperature of the entire superconducting coil 2 can be uniformly raised.

Fourth Embodiment

Next, the superconducting magnet apparatus 1C of the fourth embodiment will be described by referring to FIG. 9. Note that the same reference signs are assigned to the same components as the above-described embodiments, and duplicate description is omitted.

Figure 9:
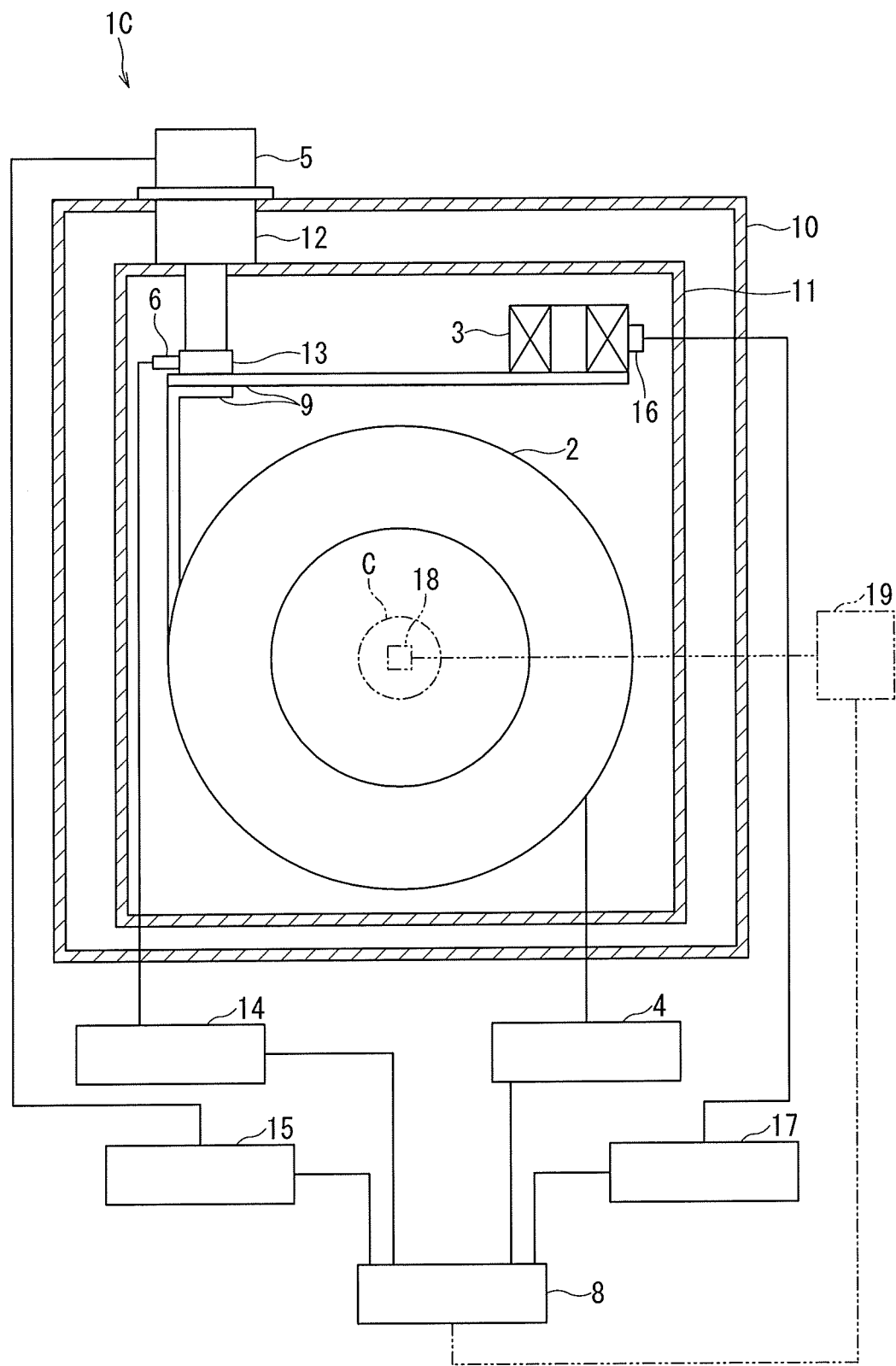
FIG. 9 is a cross-sectional view illustrating a superconducting magnet apparatus according to the fourth embodiment.

As shown in FIG. 9, in the superconducting magnet apparatus 1C of the fourth embodiment, the temperature sensor 7 (FIG. 8) of the above-described third embodiment is not provided. In the fourth embodiment, the output value necessary for the superconducting coil 2 to reach the specific temperature S is analyzed in advance and the setting value of the analyzed output value is stored in the setting memory 20 (FIG. 2). The control device 8 controls the operation of the superconducting magnet apparatus 1C in the actual operation stage only on the basis of the output value and the output period that are stored in the setting memory 20.

Since the temperature sensor 7 is omitted in the fourth embodiment, it is possible to simplify the control of adjusting the temperature of the superconducting coil 2 to the specific temperature S, in addition to that number of components of the superconducting magnet apparatus 1C can be reduced.

Fifth Embodiment

Next, the superconducting magnet apparatus 1D of the fifth embodiment will be described by referring to FIG. 10 to FIG. 15. Note that the same reference signs are assigned to the same components as the above-described embodiments, and duplicate description is omitted.

Figure 10:
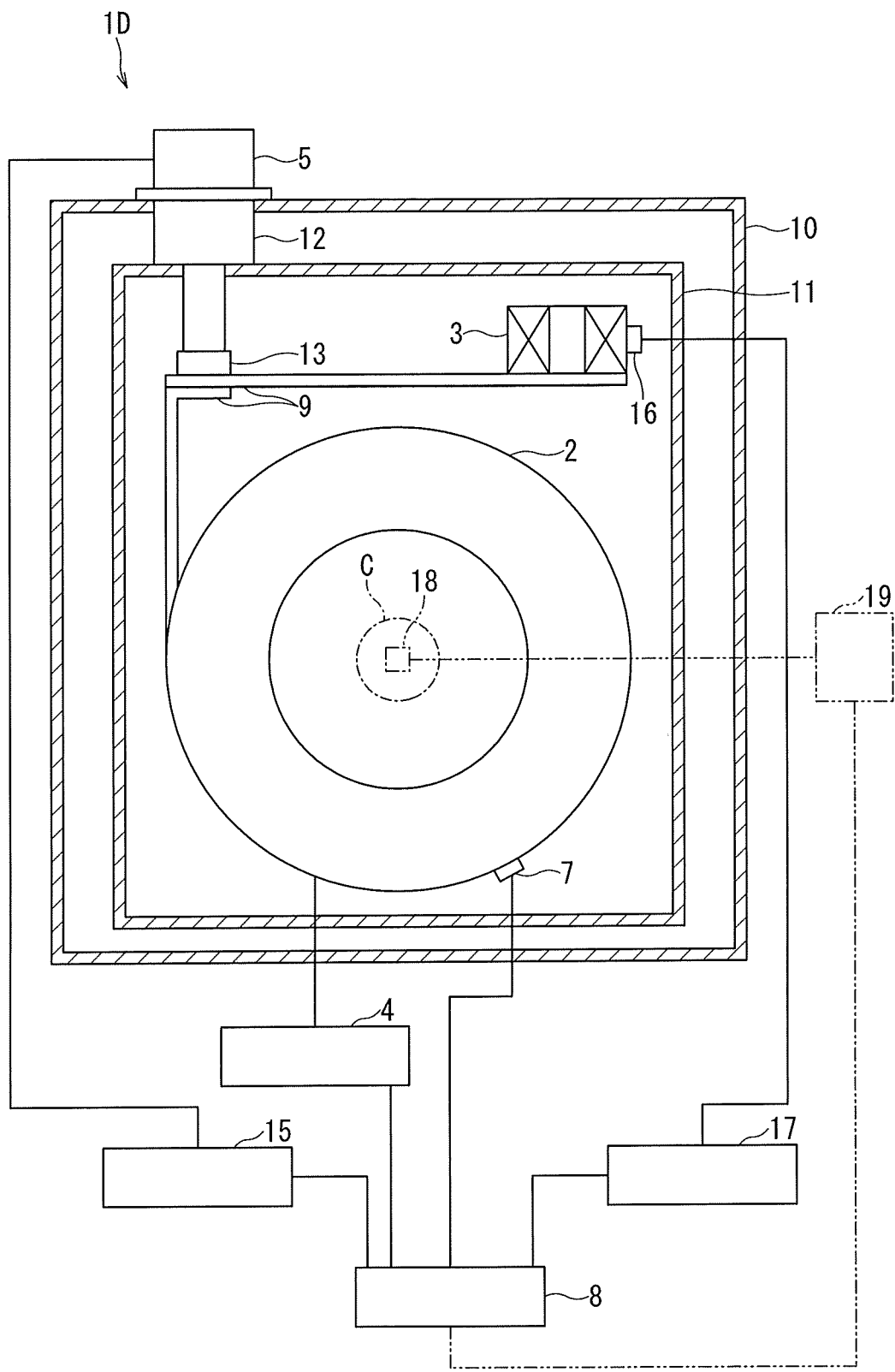
FIG. 10 is a cross-sectional view illustrating a superconducting magnet apparatus according to the fifth embodiment.
Figure 11:
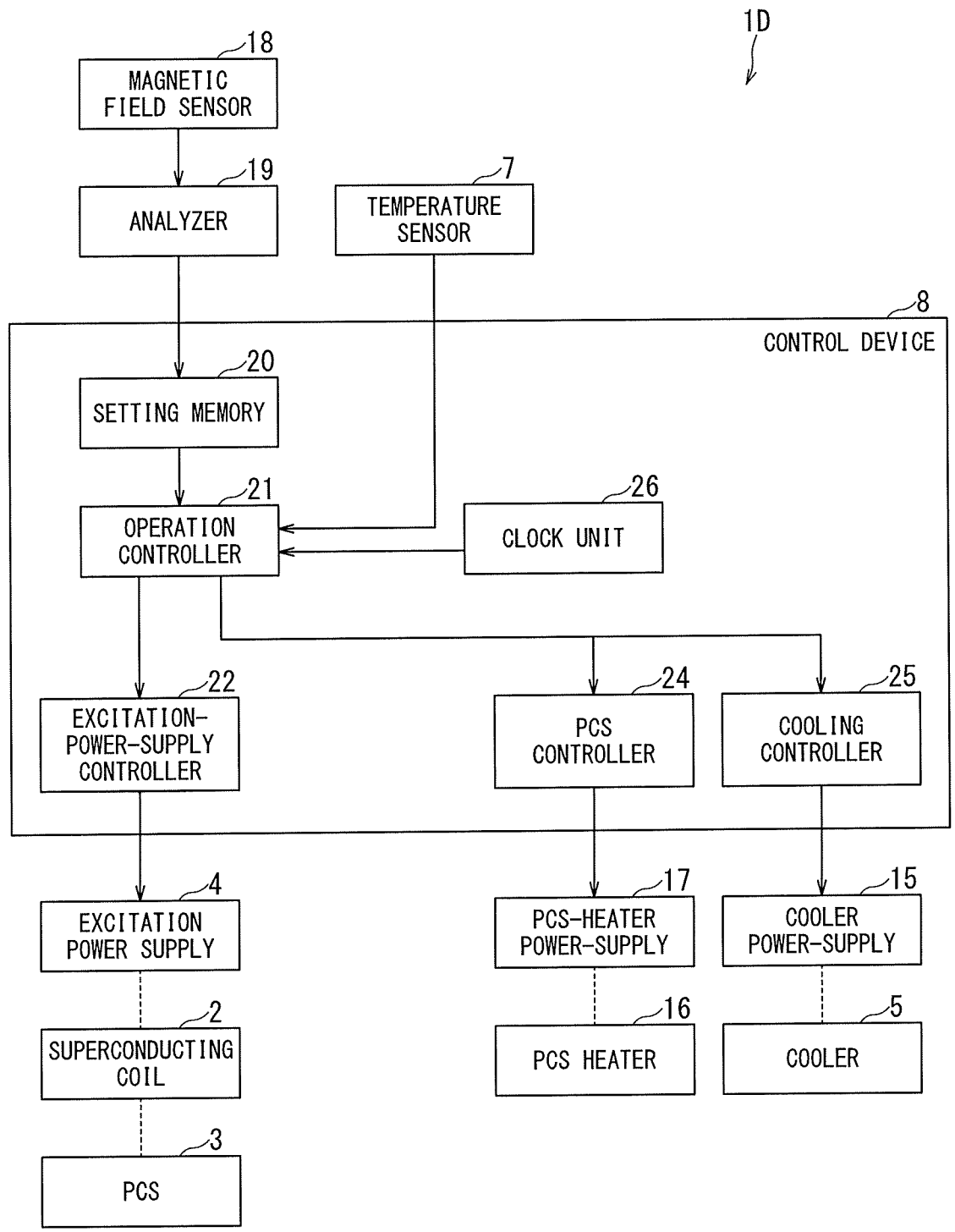
FIG. 11 is a block diagram illustrating the superconducting magnet apparatus according to the fifth embodiment.

As shown in FIG. 10 and FIG. 11, in the superconducting magnet apparatus 1D of the fifth embodiment, the coil heater 6 (FIG. 1) and the specific-temperature controller 23 (FIG. 2) of the above-described first embodiment are not provided. In the fifth embodiment, the cooling controller 25 for controlling the cooler 5 functions as the specific-temperature controller for adjusting the temperature of the superconducting coil 2 to the specific temperature S.

In the fifth embodiment, after the persistent current mode is started by using the superconducting coil 2 that has transitioned to the superconductive state, the temperature of the superconducting coil 2 is raised by stopping the cooler 5. By this temperature rise, the eddy current inside the superconducting coil 2 disappears and thereby the noise magnetic field disappears. By starting the steady operation after this dissipation of the eddy current, the central magnetic field C does not change even when the cooler 5 temporarily stops due to a phenomenon such as power outage.

Figure 12:
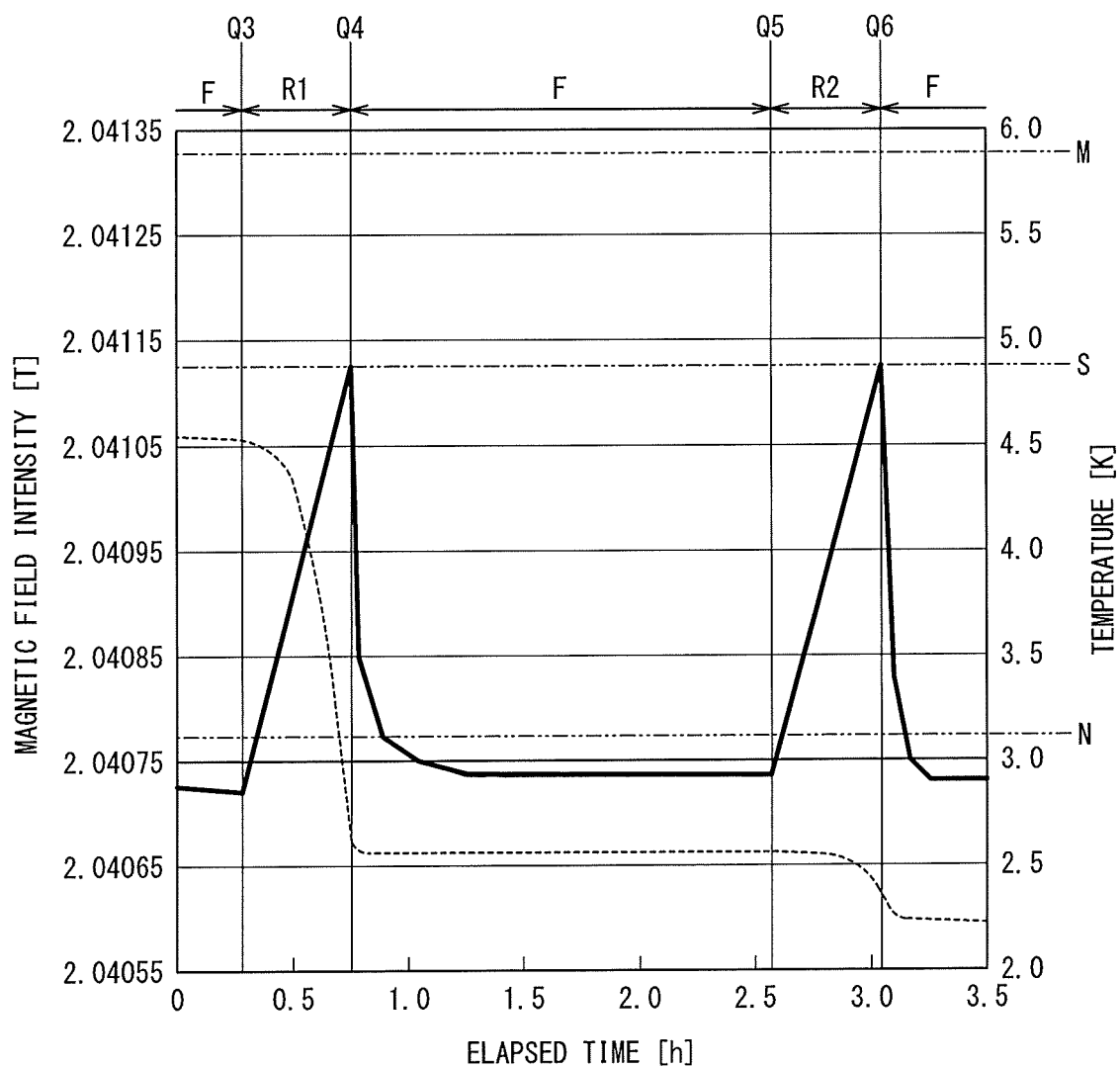
FIG. 12 is a graph illustrating relationship between the central magnetic field and temperature in the fifth embodiment.

FIG. 12 is a graph illustrating one case of the relationship between the central magnetic field C and the temperature of the superconducting coil 2. In FIG. 12, the temperature of the superconducting coil 2 is indicated by the solid line and the intensity value (Tesla) of the central magnetic field C is indicated by the broken line.

First, when the cooler 5 is used to cool the superconducting coil 2 to or below the critical temperature M, this superconducting coil 2 is caused to transition to the superconductive state. In the temperature-fall period F immediately after the transition to the superconductive state, the superconducting coil 2 is cooled to the steady operation temperature N or lower. Here, the central magnetic field C shows a stronger intensity value because it contains a noise magnetic field.

The cooler 5 is stopped at the time Q3 in order to raise the temperature of the superconducting coil 2. After the time Q3, the temperature of the superconducting coil 2 gradually rises and reaches the specific temperature S. This specific temperature S is equal to or lower than the critical temperature M and higher than the steady operation temperature N.

Afterward, at the time Q4 when the temperature of the superconducting coil 2 reaches or slightly exceeds the specific temperature S, the cooler 5 is activated again to cool the superconducting coil 2 to or below the steady operation temperature N. The period from the time Q3 to the time Q4 is defined as the first temperature-rise period R1.

In the first temperature-rise period R1, the eddy current inside the superconducting coil 2 disappears, and thereby the noise magnetic field also disappears. Thus, the intensity value of the central magnetic field C decreases. Afterward, at the time Q5 after elapse of the predetermined temperature-fall period F, the cooler 5 is stopped again to raise the temperature of the superconducting coil 2. After the time Q5, the temperature of the superconducting coil 2 gradually rises and reaches the specific temperature S again.

Afterward, at the time QG when the temperature of the superconducting coil 2 reaches or slightly exceeds the specific temperature S, the cooler 5 is activated again to cool the superconducting coil 2 to or below the steady operation temperature N. The period from the time Q5 to the time QG is defined as the second temperature-rise period R2.

Also in this second temperature-rise period R2, the eddy current inside the superconducting coil 2 disappears and thereby the noise magnetic field also disappears. In the second temperature-rise period R2, the decreasing rate of the intensity value of the central magnetic field C is smaller than that of the first temperature-rise period R1. This indicates that most of the noise magnetic field disappeared in the first temperature-rise period R1.

In the fifth embodiment, the cooler 5 is repeatedly stopped and activated until decrease in intensity value of the central magnetic field C in each temperature-rise period R (R1, R2, . . . ) is no longer observed. In this case, the specific conditions are the time interval of each temperature-rise period R and repeat count of the temperature-rise periods R, wherein both conditions are required until decrease in intensity value of the central magnetic field C ceases.

The time interval of each temperature-rise period R and the repeat count of the temperature-rise periods R are determined by analysis in advance. The determined time interval of each temperature-rise period R and the determined repeat count of the temperature-rise periods R are stored in the setting memory 20 of the superconducting magnet apparatus 1.

The operation controller 21 (FIG. 3) of the control device 8 of the fifth embodiment determines whether the superconducting coil 2 has reached the specific temperature S or not, on the basis of the temperature detected by the temperature sensor 7. The operation controller 21 determines whether the temperature-rise period R has elapsed or not, by time-counting processing with the use of the clock unit 26.

Next, a description will be given of the analysis method performed by the superconducting magnet apparatus 1D for previously analyzing the specific conditions, under which the fluctuating component of the central magnetic field C disappears, on the basis of the flowchart of FIG. 14 by referring to the block diagram of FIG. 11 as required.

Figure 14:
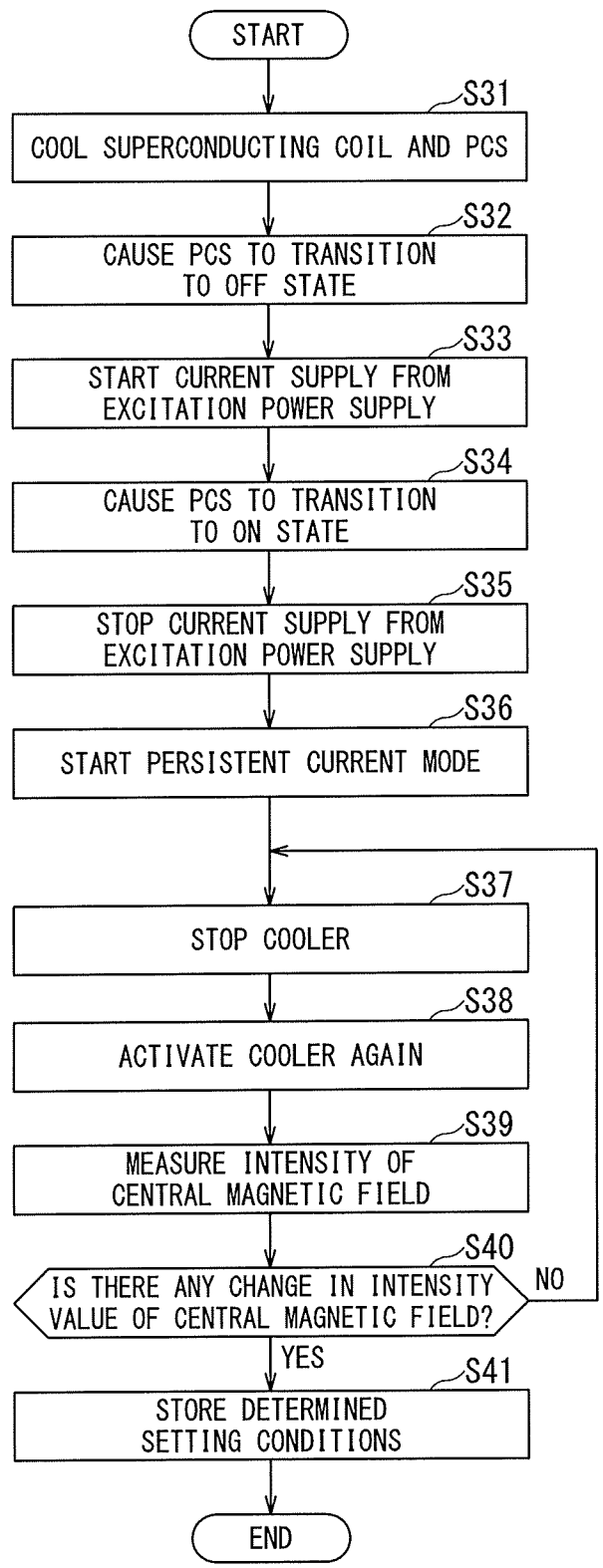
FIG. 14 is a flowchart illustrating an analysis method performed by the superconducting magnet apparatus according to the fifth embodiment.

First, in the step S31 as shown in FIG. 14, the cooling controller 25 starts cooling the superconducting coil 2 and the persistent current switch 3 by supplying electric current from the cooler power-supply 15 to the cooler 5 and activating the cooler 5. When the cooling operation starts, the superconducting coil 2 and the persistent current switch 3 are cooled to the critical temperature M or lower. When reaching the critical temperature M, the superconducting coil 2 and the persistent current switch 3 transition to the superconductive state. The superconducting coil 2 and the persistent current switch 3 are further cooled down until both reach the steady operation temperature N.

In the next step S32, under the state where cooling by the cooler 5 is continued, the PCS controller 24 supplies electric current from the PCS-heater power-supply 17 to the PCS heater 16 and activates the PCS heater 16. Further, the PCS controller 24 uses the PCS heater 16 for heating the persistent current switch 3 so as to adjust the temperature of the persistent current switch 3 to a temperature higher than the critical temperature M. Consequently, the persistent current switch 3 transitions to the normal conducting state (i.e., OFF state) of high electrical resistance.

In the next step S33, the excitation-power-supply controller 22 starts supply of electric current by controlling the excitation power supply 4, and starts passing electric current through the superconducting coil 2. Consequently, the value of the electric current flowing through the superconducting coil 2 becomes the value in the steady operation.

In the next step S34, the PCS controller 24 stops the electric current supplied from the PCS-heater power-supply 17 to the PCS heater 16, and decrease the temperature of the persistent current switch 3 again. When the temperature of the persistent current switch 3 becomes equal to or lower than the critical temperature M, the persistent current switch 3 transitions to the superconductive state (ON state) under which electric resistance is zero.

In the next step S35, the excitation-power-supply controller 22 stops the current supply by controlling the excitation power supply 4. At this time, the electric current flowing through the persistent current switch 3 starts to increase in response to the decrease in current supply amount from the excitation power supply 4.

In the next step S36, when the value of the electric current supplied from the excitation power supply 4 becomes zero, the electric current flowing through the persistent current switch 3 becomes the value in the steady operation. Further, the closed loop L is completed by the superconducting coil 2 and the persistent current switch 3, and the persistent current mode is started.

In the next step S37, the cooling controller 25 stops the current supply from the cooler power-supply 15 to the cooler 5 so as to raise the temperature of the superconducting coil 2. The cooling controller 25 causes the cooler 5 to continue the stopped state until the superconducting coil 2 reaches the specified temperature S. Incidentally, the operation controller 21 may determine whether the superconducting coil 2 has reached the specific temperature S or not on the basis of the temperature detected by the temperature sensor 7 so as to input the determination result to the cooling controller 25. In this case, the cooling controller 25 may control the cooler 5 on the basis of the determination result.

In the next step S38, the cooling controller 25 supplies electric current from the cooler power-supply 15 to the cooler 5, and activates the cooler 5 again when the temperature of the superconducting coil 2 reaches or exceeds the specific temperature S. Note that the cooling controller 25 may activate the cooler 5 again on the basis of time-counting processing performed by the clock unit 26 when the predetermined temperature-rise period R elapses.

In the next step S39, the analyzer 19 uses the magnetic field sensor 18 to measure intensity of the central magnetic field C of the superconducting coil 2.

In the next step S40, the analyzer 19 determines whether there is a change in intensity value of the central magnetic field C or not. When there is no change in intensity value of the central magnetic field C (NO in the step S40), the processing returns to the above-described step S37. Conversely, when there is change in intensity value of the central magnetic field C (YES in the step S40), the processing proceeds to the step S41.

In the next step S41, the analyzer 19 determines the time interval of each temperature-rise period R and the repeat count of the temperature-rise periods R, both of which are necessary for raising the temperature of the superconducting coil 2 to the specific temperature S. The determined time interval and repeat count are stored in the setting memory 20 of the superconducting magnet apparatus 1.

Next, the control method (i.e., operation method) for the superconducting magnet apparatus 1D in the actual operation stage will be described on the basis of the flowchart of FIG. 15 by referring to the block diagram of FIG. 11 as required. In the control method for the superconducting magnet apparatus 1D, the steps S31 to S38 in FIG. 15 are the same as the steps S31 to S38 in FIG. 14 for illustrating the analysis method performed by the superconducting magnet apparatus 1, and duplicate description is omitted.

Figure 15:
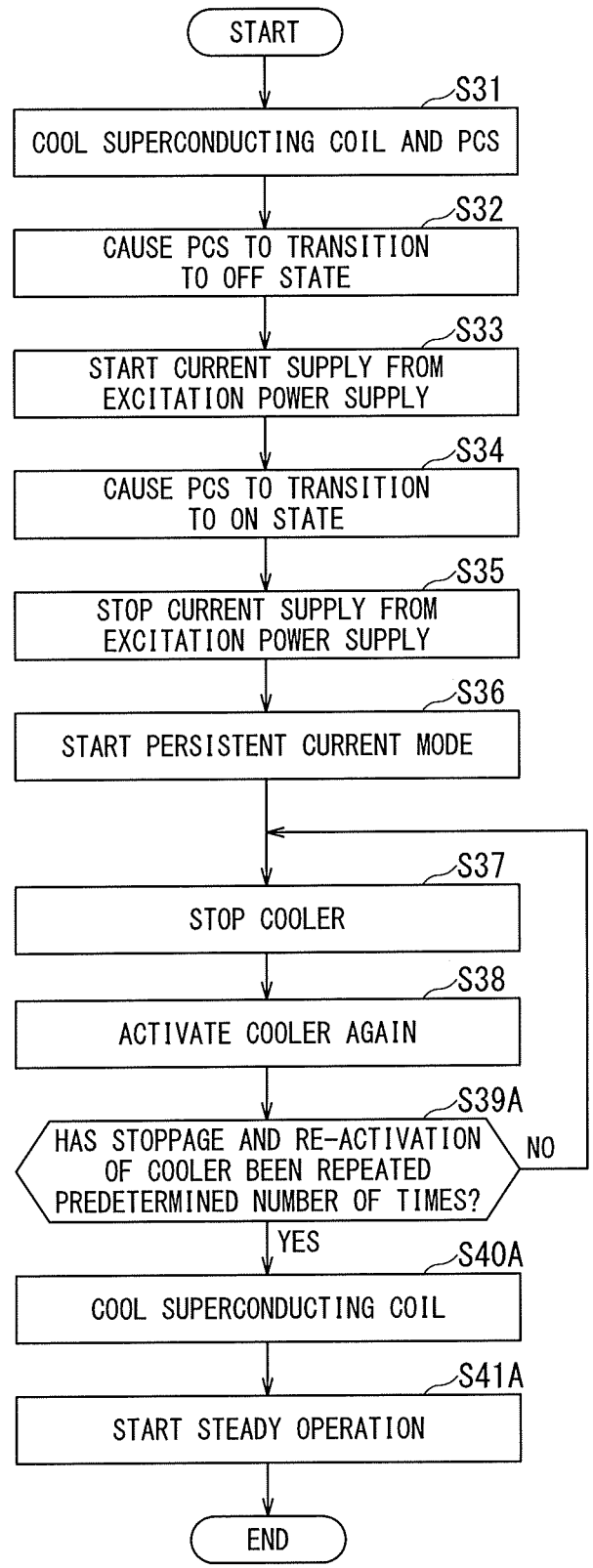
FIG. 15 is a flowchart illustrating a control method for the superconducting magnet apparatus according to the fifth embodiment.

As shown in FIG. 15, in the step S39A subsequent to the step S38, the operation controller 21 determines whether the stoppage and re-activation of the cooler 5 has been repeated the predetermined number of times stored in the setting memory 20 or not. When the stoppage and re-activation of the cooler 5 has not been repeated the predetermined number of times (NO in step S39A), the processing returns to the step S37. Conversely, when the stop and re-activation of the cooler 5 has been repeated the predetermined number of times (YES in step S39A), the processing proceeds to the step S40A.

In the next step S40A, the cooling controller 25 cools the superconducting coil 2 again by supplying electric current from the cooler power-supply 15 to the cooler 5 and activating the cooler 5.

In the next step S41A, the steady operation is started by using the superconducting coil 2 that has cooled down to the steady operation temperature N.

In the fifth embodiment, the cooler 5 is stopped to raise the temperature of the superconducting coil 2 up to the specific temperature S, and the cooler 5 is activated again when the temperature of the superconducting coil 2 reaches the specific temperature S. By repeating the stoppage and re-activation of the cooler 5 at predetermined time intervals for a predetermined number of times, the specific conditions are satisfied. In this manner, the fluctuating component of the central magnetic field C can be reliably eliminated by control of the cooler 5.

Although the stoppage and re-activation of the cooler 5 is repeated the predetermined number of times in the fifth embodiment, it is not required to repeat the stoppage and re-activation of the cooler 5 when the fluctuating component of the central magnetic field C can be reliably eliminated by performing the stoppage and re-activation of the cooler 5 once.

Figure 13:
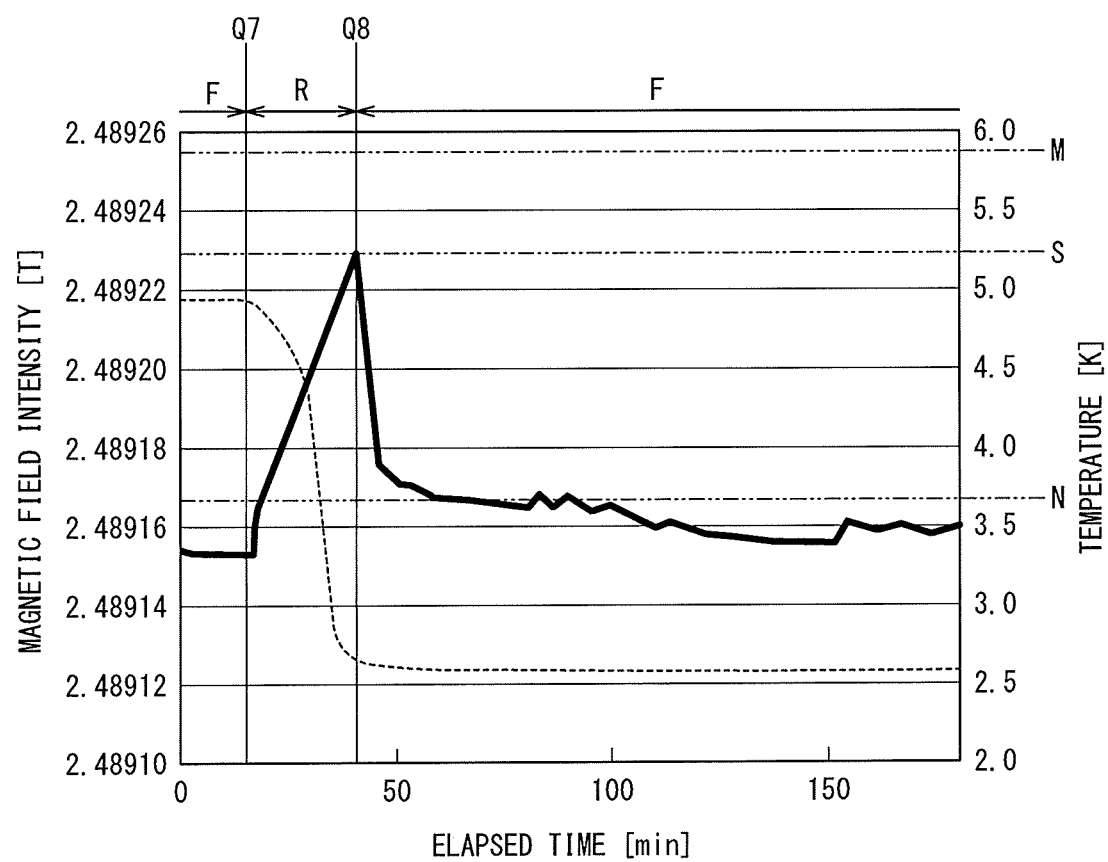
FIG. 13 is a graph illustrating relationship between the central magnetic field and temperature in a modification.

FIG. 13 is a graph illustrating the relationship between the intensity of the central magnetic field C and the temperature of the superconducting coil 2 as one modification. In FIG.

13, the temperature of the superconducting coil 2 is indicated by the solid line and the intensity value of the central magnetic field C is indicated by the broken line.

First, when the cooler 5 is used for cooling the superconducting coil 2 to the critical temperature M or lower, the superconducting coil 2 is caused to transition to the superconductive state. In the temperature-fall period F immediately after this transition to the superconductive state, the superconducting coil 2 is cooled to or below the steady operation temperature N. Here, the central magnetic field C shows a stronger intensity value because it contains a noise magnetic field.

At the time Q7, the cooler 5 is stopped to raise the temperature of the superconducting coil 2. After the time Q7, the temperature of the superconducting coil 2 gradually rises and reaches the specific temperature S. This specific temperature S is equal to or lower than the critical temperature M and higher than the steady operation temperature N.

Afterward, at the time Q8 when the temperature of the superconducting coil 2 reaches or slightly exceeds the specific temperature S, the cooler 5 is activated again to cool the superconducting coil 2 again to the steady operation temperature N or lower. The intensity value of the central magnetic field C abruptly drops during the first temperature-rise period R from the time Q7 to the time Q8, and it can be seen that decrease in intensity value of the central magnetic field C ceases before the time Q8.

In this modification, by stopping the cooler 5 once, the temperature of the superconducting coil 2 is raised until reaching the specific temperature S, and the specific conditions are satisfied when the superconducting coil 2 reaches the specific temperature S. In this manner, it is possible to satisfy the specific conditions by controlling the operation of the cooler 5.

Sixth Embodiment

Next, the superconducting magnet apparatus 1E of the sixth embodiment will be described by referring to FIG. 16. Note that the same reference signs are assigned to the same components as the above-described embodiments, and duplicate description is omitted.

Figure 16:
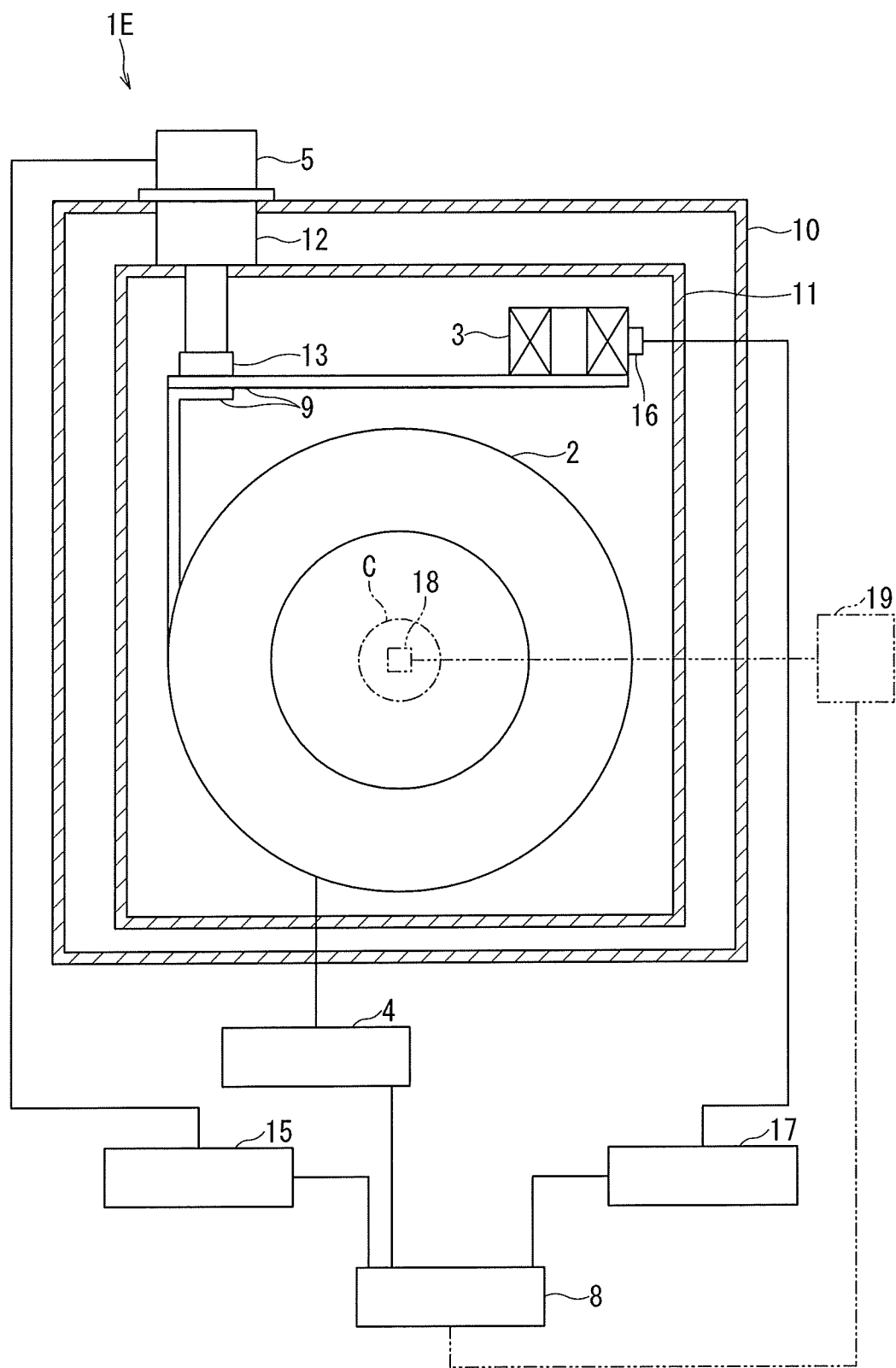
FIG. 16 is a cross-sectional view illustrating a superconducting magnet apparatus according to the sixth embodiment.

As shown in FIG. 16, in the superconducting magnet apparatus 1E of the sixth embodiment, the temperature sensor 7 (FIG. 10) of the fifth embodiment is not provided. In the sixth embodiment, the output value necessary for the superconducting coil 2 to reach the specific temperature S is analyzed and determined in advance and the determined output value is stored as its setting value in the setting memory 20 (FIG. 11). The control device 8 controls the operation of the superconducting magnet apparatus 1E in the actual operation stage only on the basis of the output value and the output period that are stored in the setting memory 20.

Since the temperature sensor 7 is omitted in the sixth embodiment, it is possible to simplify the control of adjusting the temperature of the superconducting coil 2 to the specific temperature S, in addition to that number of components of the superconducting magnet apparatus 1E can be reduced.

Although the control method for a superconducting magnet apparatus according to the possible embodiments has been described on the basis of the first to the sixth embodiments, the configuration applied in any one of the embodiments may be applied to other embodiments and the configurations applied in each embodiment may be used in combination.

In the present embodiment, the determination of one value using a reference value may be determination of whether the target value is equal to or larger than the reference value or not.

Additionally or alternatively, the determination of the target value using the reference value may be determination of whether the target value exceeds the reference value or not.

Additionally or alternatively, the determination of the target value using the reference value may be determination of whether the target value is equal to or smaller than the reference value or not.

Additionally or alternatively, the determination of the one value using the reference value may be determination of whether the target value is smaller than the reference value or not.

Additionally or alternatively, the reference value is not necessarily fixed and the reference value may be changed. Thus, a predetermined range of values may be used instead of the reference value, and the determination of the target value may be determination of whether the target value is within the predetermined range or not.

In addition, an error occurring in the apparatus may be analyzed in advance, and a predetermined range including the error range centered on the reference value may be used for determination.

Although a mode in which each step is executed in series is illustrated in the flowcharts of the present embodiment, the execution order of the respective steps is not necessarily fixed and the execution order of part of the steps may be changed. Additionally, some steps may be executed in parallel with another step.

The control device 8 of the present embodiment includes a storage device such as a ROM (Read Only Memory) and a RAM (Random Access Memory), an external storage device such as a HDD (Hard Disk Drive) and an SSD (Solid State Drive), a display device such as a display, an input device such as a mouse and a keyboard, a communication interface, and a control device which has a highly integrated processor such as a special-purpose chip, an FPGA (Field Programmable Gate Array), a GPU (Graphics Processing Unit), and a CPU (Central Processing Unit). The control device 8 can be achieved by hardware configuration with the use of a normal computer.

Note that each program executed in the control device 8 of the present embodiment is provided by being incorporated in a memory such as a ROM in advance. Additionally or alternatively, each program may be provided by being stored as a file of installable or executable format in a non-transitory computer-readable storage medium such as a CD-ROM, a CD-R, a memory card, a DVD, and a flexible disk (FD).

In addition, each program executed in the control device 8 may be stored on a computer connected to a network such as the Internet and be provided by being downloaded via a network. Further, the control device 8 can also be configured by interconnecting and combining separate modules, which independently exhibit respective functions of the components, via a network or a dedicated line.

It is not necessarily required that the superconducting coil 2 and the persistent current switch 3 are cooled by using one cooler 5. For instance, plural cooling units may be provided as one cooler for cooling the superconducting coil 2 and another cooler for cooling the persistent current switch 3.

Although the conduction cooling method is exemplified as a method for cooling the superconducting coil 2 and the persistent current switch 3 in the above-described embodiments, another cooling method may be applied. For instance, a helium cooling system with the use of liquid helium as a refrigerant may be applied. Further, a cooling method with the use of liquid nitrogen may be applied.

According to at least one embodiment described above, after the specific conditions for stabilizing the magnetic field of the superconducting coil are satisfied, the magnetic field can be stabilized by cooling the superconducting coil to or below the steady operation temperature and starting the steady operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A control method for a superconducting magnet apparatus, comprising:
    causing a superconducting coil to transition to a superconductive state by causing a cooler to cool the superconducting coil to or below a critical temperature and below a steady operation temperature;
    supplying an electric current to the superconducting coil, which has transitioned to the superconductive state, from an excitation power supply;
    starting a persistent current mode by stopping a supply of the electric current;
    adjusting the temperature of the superconducting coil to a specific temperature which is equal to or lower than the critical temperature and higher than the steady operation temperature; and
    starting a steady operation by cooling the superconducting coil to or below the steady operation temperature, after a specific condition for stabilizing a magnetic field of the superconducting coil is satisfied.

2. The control method for the superconducting magnet apparatus according to claim 1, further comprising determining the specific condition, under which a fluctuating component of the magnetic field disappears, by an analysis in advance.

3. The control method for the superconducting magnet apparatus according to claim 1, wherein
    the temperature of the superconducting coil is raised until reaching the specific temperature, and
    the temperature of the superconducting coil is kept at the specific temperature until the specific condition is satisfied.

4. The control method for the superconducting magnet apparatus according to claim 1, wherein the specific condition is satisfied by using a heater for heating the superconducting coil to the specific temperature and activating the heater until a predetermined output period elapses.

5. The control method for the superconducting magnet apparatus according to claim 4, wherein the heater is provided in the superconducting coil.

6. The control method for the superconducting magnet apparatus according to claim 4, wherein the heater is provided in a conduction unit that conducts heat from the superconducting coil to the cooler.

7. The control method for the superconducting magnet apparatus according to claim 1, wherein
    the temperature of the superconducting coil is raised to the specific temperature by stopping the cooler, and
    the specific condition is satisfied when the temperature of the superconducting coil reaches the specific temperature.

8. The control method for the superconducting magnet apparatus according to claim 1, wherein
    the superconducting coil is heated to the specific temperature by stopping the cooler,
    the cooler is activated again when the temperature of the superconducting coil reaches the specific temperature, and
    the specific condition is satisfied by repeating stoppage and re-activation of the cooler a predetermined number of times.

* * * * *